US010295867B2

(12) United States Patent
Kim et al.

(10) Patent No.: US 10,295,867 B2
(45) Date of Patent: May 21, 2019

(54) LCD AND MANUFACTURING METHOD THEREOF

(71) Applicant: SAMSUNG DISPLAY CO., LTD., Yongin-si, Gyeonggi-do (KR)

(72) Inventors: Jang Hyun Kim, Hwaseong-si (KR); Min Su Kim, Seoul (KR); Tae Gyun Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 28 days.

(21) Appl. No.: 15/140,576

(22) Filed: Apr. 28, 2016

(65) Prior Publication Data

US 2017/0102569 A1 Apr. 13, 2017

(30) Foreign Application Priority Data

Oct. 12, 2015 (KR) ........................ 10-2015-0142224

(51) Int. Cl.
  *G02F 1/1339* (2006.01)
  *H01L 27/12* (2006.01)
  *G02F 1/1333* (2006.01)

(52) U.S. Cl.
  CPC ...... *G02F 1/1339* (2013.01); *G02F 1/133345* (2013.01); *G02F 1/133351* (2013.01); *H01L 27/124* (2013.01)

(58) Field of Classification Search
  CPC .................................................. G02F 1/1339
  See application file for complete search history.

(56) References Cited

U.S. PATENT DOCUMENTS

| | | | | |
|---|---|---|---|---|
| 2007/0291216 A1* | 12/2007 | Chan | ...................... | G02F 1/1339 349/153 |
| 2009/0135348 A1* | 5/2009 | White | ............... | G02F 1/136209 349/106 |
| 2010/0149477 A1* | 6/2010 | Nagami | ................ | G02F 1/1339 349/138 |
| 2014/0092357 A1* | 4/2014 | Chen | ...................... | G02F 1/1333 349/155 |
| 2016/0075949 A1* | 3/2016 | Kawamura | ............ | C09K 19/20 252/299.61 |

FOREIGN PATENT DOCUMENTS

| | | |
|---|---|---|
| KR | 100659931 B1 | 12/2006 |
| KR | 100701013 B1 | 3/2007 |
| KR | 100752209 B1 | 8/2007 |
| KR | 100802264 B1 | 1/2008 |
| KR | 1020120116809 A | 10/2012 |
| KR | 1020130143300 A | 12/2013 |

* cited by examiner

*Primary Examiner* — Edmond C Lau
(74) *Attorney, Agent, or Firm* — Cantor Colburn LLP

(57) ABSTRACT

A liquid crystal display includes: a first substrate on which a display area and a non-display area disposed on an outside of the display area are defined; a first insulating layer, which is disposed in the non-display area on the first substrate; a barrier pattern, which is disposed on the first insulating layer; a seal pattern, which is disposed on the barrier pattern to overlap the barrier pattern; and a second substrate, which is disposed to face the first substrate.

5 Claims, 13 Drawing Sheets

LCD AND MANUFACTURING METHOD THEREOF

This application claims priority to Korean Patent Application No. 10-2015-0142224, filed on Oct. 12, 2015, and all the benefits accruing therefrom under 35 U.S.C. § 119, the content of which in its entirety is incorporated herein by reference.

BACKGROUND

1. Field

The invention relates to a liquid crystal display ("LCD") and a manufacturing method thereof.

2. Description of the Related Art

The demand of display devices has steadily grown with recent developments in multimedia technology. As a result, a variety of display devices such as a liquid crystal display ("LCD"), an organic light-emitting diode ("OLED"), and the like have been developed and widely used.

The LCD, which is one of the most widely-used types of flat panel display, typically includes two substrates, on which field-generating electrodes such as pixel electrodes and a common electrode are provided, and a liquid crystal layer interposed between the two substrates. The LCD generates an electric field in the liquid crystal layer by applying a voltage to the field-generating electrodes, and thus displays an image by determining the orientation of liquid crystal molecules in the liquid crystal layer and controlling the polarization of incident light.

Recently, as the size and the resolution of the LCD increases, the amount of wiring for precise control of the LCD gradually increases. However, the larger the area occupied by such wiring is, the larger the area of a non-display area becomes, and a narrow-bezel display device may not be effectively realized. Accordingly, various attempts are being made to realize a narrow-bezel LCD and develop ways to sophisticatedly control an LCD.

SUMMARY

Exemplary embodiments of the invention provide a liquid crystal display ("LCD") with a reduced non-display area.

Exemplary embodiments of the invention also provide an LCD in which an out gas that may be formed during a cutting process is prevented from infiltrating into the inside of a display area.

Exemplary embodiments of the invention also provide a manufacturing method of an LCD with a reduced non-display area by reducing the area used for a cutting process.

Exemplary embodiments of the invention also provide a manufacturing method of an LCD in which an out gas that may be formed during a cutting process is effectively prevented is from infiltrating into the inside of a display area.

However, exemplary embodiments of the invention are not restricted to those set forth herein. The above and other exemplary embodiments of the invention will become more apparent to one of ordinary skill in the art to which the invention pertains by referencing the detailed description of the invention given below.

According to an exemplary embodiment of the invention, an LCD includes: a first substrate on which a display area and a non-display area disposed on an outside of the display area are defined; a first insulating layer, which is disposed in the non-display area on the first substrate; a barrier pattern, which is disposed on the first insulating layer; a seal pattern, which is disposed on the barrier pattern to overlap the barrier pattern; and a second substrate, which is disposed to face the first substrate.

In an exemplary embodiment, the LCD may further include a second insulating layer disposed on the barrier pattern.

In an exemplary embodiment, the LCD may further include an alignment layer disposed on the barrier pattern.

In an exemplary embodiment, a height of the barrier pattern may be the same as about a half of a distance from the first substrate to the second substrate by 2.

In an exemplary embodiment, the height of the barrier pattern may be less than about a half of the distance from the first substrate to the second substrate by 2.

In an exemplary embodiment, the seal pattern may completely cover the barrier pattern when viewed from a top plan view.

In an exemplary embodiment, the barrier pattern may include a metal layer.

In an exemplary embodiment, the barrier pattern may include a first layer barrier pattern and a second layer barrier pattern, which is disposed on the first layer barrier pattern.

In an exemplary embodiment, the barrier pattern is provided in plural, and a plurality of barrier patterns may be disposed to be isolated from one another.

In an exemplary embodiment, the seal pattern may be disposed along an outer circumference of the non-display area.

In an exemplary embodiment, an external side surface of the seal pattern may be aligned with a side surface of the first substrate.

According to another exemplary embodiment of the invention, a manufacturing method of an LCD includes: preparing a first substrate, on which a display area and a non-display area disposed on the outside of the display area are defined, a first insulating layer is provided in the non-display area, a barrier pattern is provided on the first insulating layer, and a seal pattern is provided to overlap the barrier pattern, and a second substrate, which is disposed to face the first substrate; and cutting the first substrate and the second substrate by irradiating laser along the seal pattern of the first substrate.

In an exemplary embodiment, a cutting line may be formed by the laser, and the first substrate and the second substrate may be cut along the cutting line.

In an exemplary embodiment, the cutting the first substrate and the second substrate by irradiating laser along the seal pattern of the first substrate may include cutting the first substrate and the second substrate using a wheel or a blade after the irradiation of the laser.

In an exemplary embodiment, a second insulating layer may be further provided on the first substrate to be disposed on the barrier pattern.

In an exemplary embodiment, the seal pattern may completely cover the barrier pattern when viewed from a top view.

In an exemplary embodiment, the barrier pattern may include at least one metal layer.

In an exemplary embodiment, the barrier pattern may include a first layer barrier pattern and a second layer barrier pattern, which is disposed on the first layer barrier pattern.

In an exemplary embodiment, the barrier pattern may be provided in plural, and a plurality of barrier patterns may be disposed to be isolated from one another.

According to another exemplary embodiment of the invention, a manufacturing method of an LCD includes: preparing a first cell and a second cell, which are disposed adjacent to each other and are integrally formed, where each of the first cell and the second cell includes a first substrate, a first insulating layer disposed on the first substrate, a barrier pattern disposed on the first insulating layer, and a seal pattern disposed to overlap the barrier pattern, and a second substrate, which is disposed to face the first substrate; and separating the first cell and the second cell by irradiating laser along a portion of the seal pattern, which is disposed between the first cell and the second cell.

According to exemplary embodiments, an LCD with a narrow bezel may be realized.

In such embodiments, an out gas may be prevented from infiltrating into the inside of a display area.

Other features and aspects will be apparent from the following detailed description, the drawings, and the claims.

BRIEF DESCRIPTION OF THE DRAWINGS

The above and other aspects and features of this disclosure will become more apparent by describing in further detail exemplary embodiments thereof with reference to the accompanying drawings, in which.

DETAILED DESCRIPTION

Figure 1:
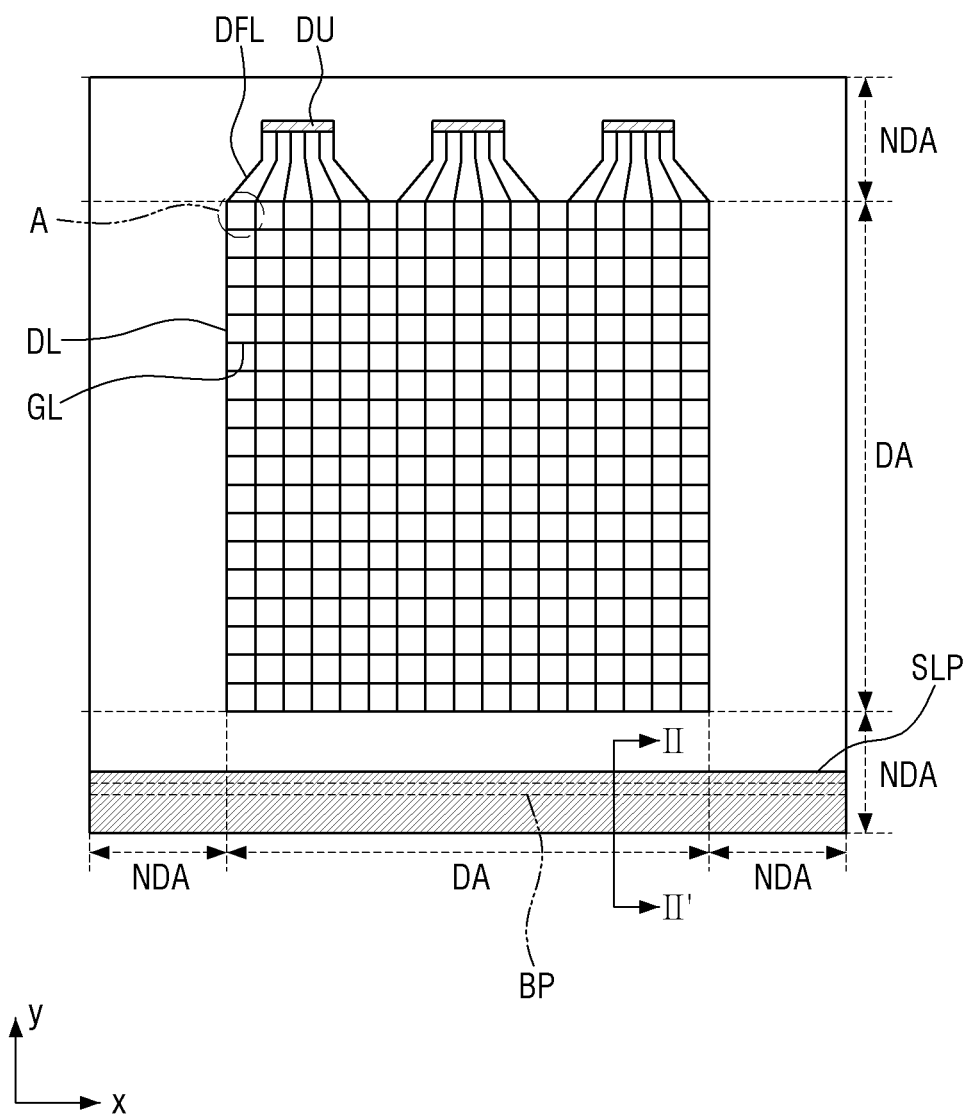
FIG. 1 is a plan view of an exemplary embodiment of a liquid crystal display (LCD) according to the invention.

The aspects and features of the invention and methods for achieving the aspects and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
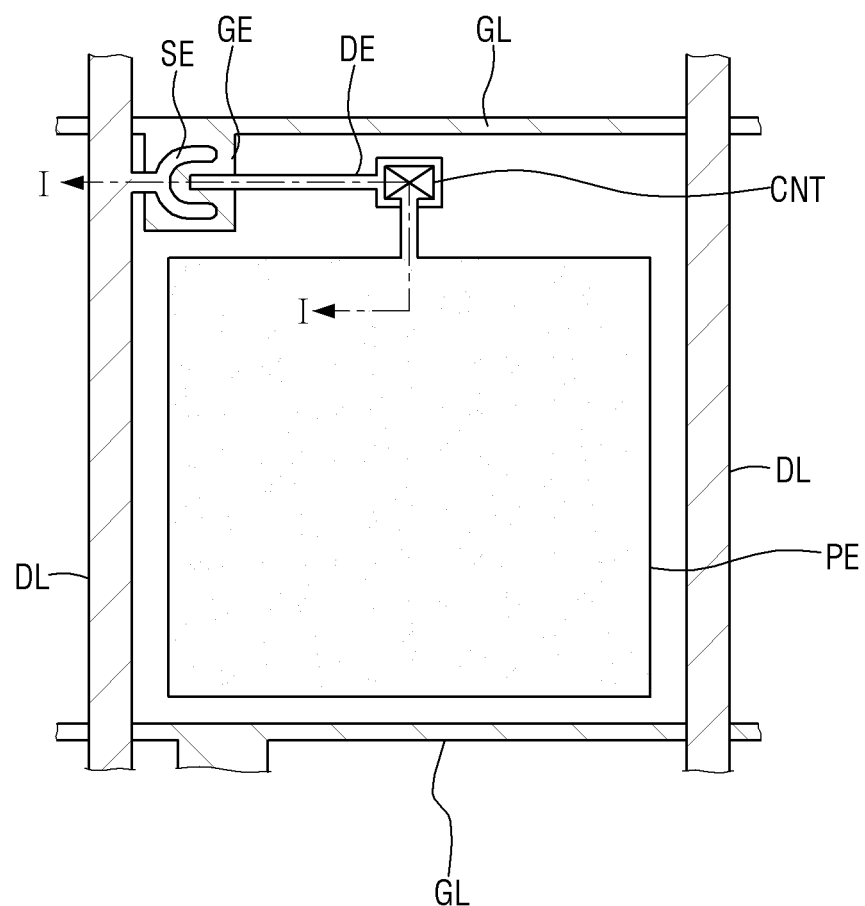
FIG. 2 is an enlarged view of an area A of FIG. 1.
Figure 3:
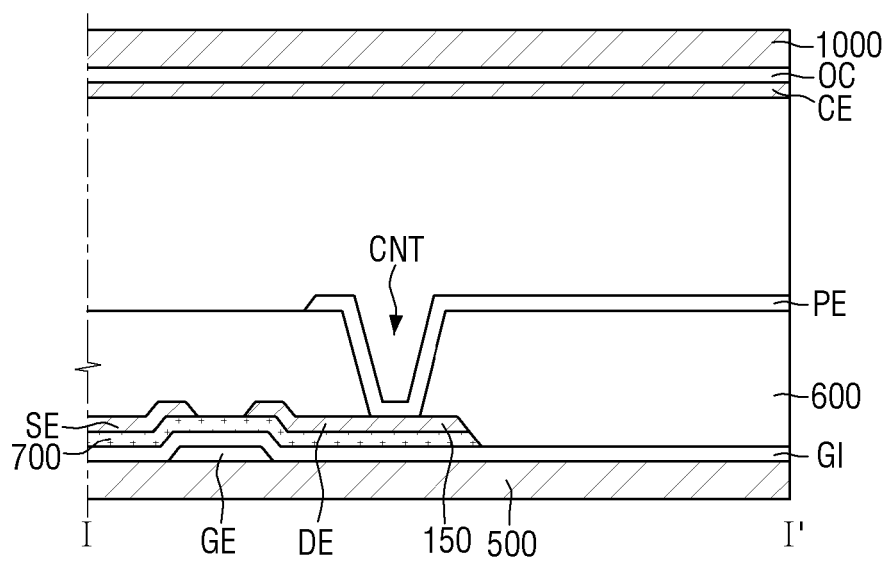
FIG. 3 is a cross-sectional view taken along line I-I' of FIG. 2.
Figure 4:
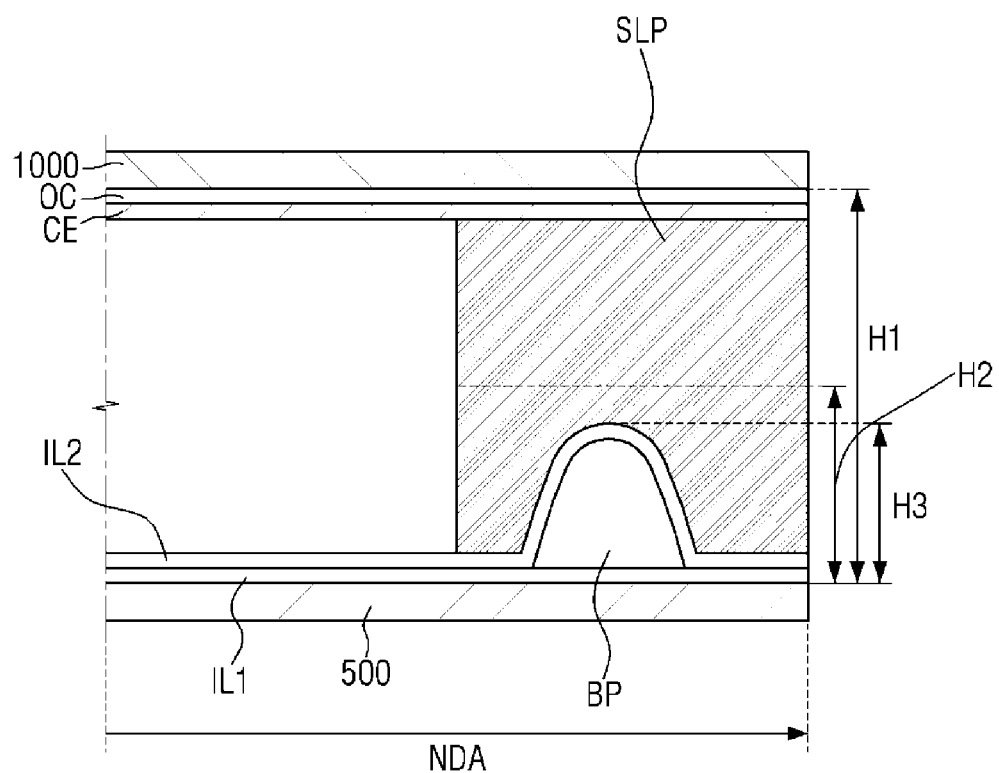
FIG. 4 is a cross-sectional view taken along line II-II' of FIG. 1.

FIG. 1 is a plan view of an exemplary embodiment of a liquid crystal display ("LCD") according to the invention. FIG. 2 is an enlarged view of an area A of FIG. 1. FIG. 3 is a cross-sectional view taken along line I-I' of FIG. 2. FIG. 4 is a cross-sectional view taken along line II-II' of FIG. 1.

Referring to FIGS. 1 through 4, an exemplary embodiment of the LCD includes a first substrate 500, in which a display area DA and a non-display area NDA that is disposed on the outside of the display area DA are defined, a first insulating layer IL1, which is disposed in the non-display area NDA on the first substrate, a barrier pattern BP, which is disposed on the first insulating layer IL1, a seal pattern SLP, which is disposed on the barrier pattern BP to overlap the barrier pattern BP, and a second substrate 1000, which faces the first substrate 500.

The first substrate 500 may include or be formed of a heat-resistant and transmissive material. The first substrate 500 may include or be formed of, for example, transparent glass or plastic, but the material of the first substrate 500 is not particularly limited. The display area DA and the non-display area NDA are defined on the first substrate 500.

The display area DA is an area in which an image is displayed, and the non-display area NDA is an area in which various signal lines are provided for displaying the image in the display area DA.

The display area DA will hereinafter be described with reference to FIGS. 2 and 3. A plurality of pixels, which are connected to a plurality of data lines DL and a plurality of gate lines GL, which intersect the data lines DL. In one exemplary embodiment, the pixels may be defined by the data lines DL and the gate lines GL, but not being limited thereto. FIG. 2 illustrates an enlarged view of one of the plurality of pixels (particularly, the area A of FIG. 1), and the display area DA may include a plurality of pixels that are substantially identical to the pixel illustrated in FIG. 2.

In such an embodiment, as shown in FIG. 3, a gate electrode GE may be disposed on the first substrate 500. The gate electrode and a corresponding gate line GL may be collectively referred to as gate wiring (GL and GE).

The gate wiring (GL and GE) may include at least one selected from an aluminum (Al)-based metal, including an Al alloy, a silver-(Ag)-based metal, including an Ag alloy, a copper (Cu)-based metal, including a Cu alloy, a molybdenum (Mo)-based metal, including a Mo alloy, chromium (Cr), titanium (Ti), and tantalum (Ta), but the material of the gate wiring (GL and GE) is not particularly limited. Alternatively, any metal or polymer material having suitable physical properties for realizing a desired display device may be used as the material of the gate wiring (GL and GE).

The gate line GL receives signals for driving the LCD. The gate line GL may extend in a first direction, for example, an x-axis direction of FIG. 2.

The gate electrode GE may protrude from the gate line GL, and may form one of three terminals of a thin-film transistor ("TFT") along with a source electrode SE and a drain electrode DE that will be described later.

The gate wiring (GL and GE) may have a single-layer structure, but the invention is not limited thereto. Alternatively, the gate wiring (GL and GE) may have a multilayer structure, such as a double- or triple-layer structure.

A gate insulating layer GI may be disposed on the first substrate 500 and the gate wiring (GL and GE). The gate insulating layer GI may cover the first substrate 500 and the gate wiring (GL and GE), and may be disposed on the entire surface of the first substrate 500.

The gate insulating layer GI may include be formed of at least one selected from an inorganic insulating material such as silicon oxide (SiOx) or silicon nitride (SiNx), benzocyclobutene ("BCB"), an acrylic material, and an organic insulating material such as polyimide ("PI"), but the invention is not limited thereto. In such an embodiment, the material of the gate insulating layer GI is not particularly limited.

A semiconductor pattern layer 700 may be disposed on the gate insulating layer GI.

The semiconductor pattern layer 700 may be disposed to at least partially overlap the source electrode SE and/or the drain electrode DE that will be described later.

A semiconductor pattern layer 700 may be disposed on the gate insulating layer GI.

The semiconductor pattern layer 700 may include amorphous silicon or polycrystalline silicon, but the invention is not limited thereto. Alternatively, the semiconductor pattern layer 700 may include an oxide semiconductor.

In an exemplary embodiment where the semiconductor pattern layer 700 includes an oxide semiconductor, the semiconductor pattern layer 700 may include zinc oxide (ZnO), and the top of the semiconductor pattern layer 700 may be doped with at least one selected from gallium (Ga) ions, indium (In) ions, tin (Sn) ions, zirconium (Zr) ions, hafnium (Hf) ions, cadmium (Cd) ions, silver (Ag) ions, copper (Cu) ions, germanium (Ge) ions, gadolinium (Gd) ions, titanium (Ti), and vanadium (V) ions. In one exemplary embodiment, for example, the semiconductor pattern layer 700 may include at least one oxide semiconductor selected from ZnO, ZnGaO, ZnInO, ZnSnO, GaInZnO, CdO, InO, GaO, SnO, AgO, CuO, GeO, GdO, HfO, TiZnO, InGaZnO, and InTiZnO, but the invention is not limited thereto. In such an embodiment, the type of the oxide semiconductor of the semiconductor pattern layer 700 is not particularly limited.

The semiconductor pattern layer 700 may have various shapes such as an island shape or a linear shape. In an exemplary embodiment where the semiconductor pattern layer 700 has a linear shape, the semiconductor pattern layer 700 may be provided below a data line DL and may extend to the top of the gate electrode GE.

In an exemplary embodiment, the semiconductor pattern layer 700 may be patterned into substantially the same shape as data wiring (DL, SE, and DE) that will be described later in an entire area except for an area of a channel portion. In such an embodiment, the semiconductor pattern layer 700 may be disposed to overlap the data wiring (DL, SE, and DE) in the entire area except for the channel portion. The channel portion may be disposed between the source electrode SE and the drain electrode DE, which face each other. The channel portion electrically connects the source electrode SE and the drain electrode DE, and the shape of the channel portion is not particularly limited.

An ohmic contact layer (not illustrated) doped with a high concentration of n-type impurities may be disposed on the semiconductor pattern layer 700. The ohmic contact layer may overlap the entire semiconductor pattern layer 700 or part of the semiconductor pattern layer 700. In an exemplary embodiment where the semiconductor pattern layer 700 includes an oxide semiconductor, the ohmic contact layer may not be provided.

The data wiring (DL, SE, and DE) may be disposed on the semiconductor pattern layer 700.

The data wiring (DL, SE, and DE) includes the data line DL, the source electrode SE, and the drain electrode DE. The data line DL may extend in a second direction, for example, a Y-axis direction of FIG. 2, and may intersect the gate line GL.

The source electrode SE may be branched off from the data line DL, may extend to the top of the semiconductor layer 700, and may be disposed to be spaced from, and face, the source electrode SE.

The data wiring (DL, SE, and DE) may have a single- or multilayer structure including a metal such as nickel (Ni), cobalt (Co), Ti, Ag, Cu, Mo, Al, beryllium (Be), Nb, gold (Au), iron (Fe), selenium (Se), or Ta or an alloy of the metal including at least one selected from Ti, Zr, tungsten (W), Ta, Nb, platinum (Pt), Hf, oxygen (0) and nitrogen (N), but the invention is not limited thereto. In such an embodiment, the material of the data wiring (DL, SE, and DE) is not particularly limited.

A passivation layer 600 may be disposed on the data wiring (DL, SE, and DE). The passivation layer 600, as a planarization layer, may cover the data line DL, the source electrode SE, the semiconductor pattern layer 700, and the drain electrode DE and may be disposed on or cover the entire surface of the first substrate 500. The passivation layer 600 may include or be formed of an organic insulating material or an inorganic insulating material.

In such an embodiment, a contact hole CNT is defined or formed through the passivation layer 600. The contact hole CNT may penetrate the passivation layer 600 and may at least partially expose the surface of the drain electrode DE.

A pixel electrode PE may be disposed on the passivation layer 600. The pixel electrode PE may be electrically connected to the drain electrode DE via the contact hole CNT, which is defined through the passivation layer 600.

The pixel electrode PE may include or be formed of a transparent conductor such as indium tin oxide ("ITO") or indium zinc oxide ("IZO") or a reflective conductor such as Al.

FIG. 2 illustrates the pixel electrode PE as having a plate shape, but the invention is not limited thereto. In an alternative exemplary embodiment, the pixel electrode PE may have a structure with one or more slits. In another alternative exemplary embodiment, a plurality of pixel electrodes PE may be provided in each pixel, in which case, different voltages may be applied to the plurality of pixel electrodes PE.

A first alignment layer (not illustrated) may be disposed on the first substrate 500 on which a plurality of pixels are provided. The first alignment layer, which is for an initial alignment of a liquid crystal layer between the first substrate 500 and the second substrate 1000 that will be described later, may include a polymer material that causes one of decomposition, dimerization, and isomerization upon exposure to light (for example, ultraviolet ("UV") light or laser). The first alignment layer may include or be formed of a polymer polymerized with reactive mesogens.

The first alignment layer may be disposed on the entire surface of the first substrate 500. In other words, the first alignment layer may be disposed across the display area DA and the non-display area NDA.

A black matrix (not illustrated) and a color filter (not illustrated) may be disposed on the second substrate 1000. The black matrix may suppress light leakage and light interference among the plurality of pixels. The black matrix may be disposed to overlap the source electrode SE, the drain electrode DE, and the semiconductor pattern layer 700, which are disposed on the first substrate 500. The black matrix may be disposed to cover the data line DL and/or the gate line GL.

The color filter may be disposed to overlap the pixel electrode PE. The color filter may include a red filter, a blue filter or a green filter.

In an alternative exemplary embodiment to the exemplary embodiment of FIG. 3, the color filter may be disposed on the first substrate 500 or may be omitted.

An overcoat layer OC may be disposed on the second substrate 1000. The overcoat layer OC may include an organic or inorganic insulating material. The overcoat layer OC may be disposed on the entire surface of the second substrate 1000 and may serve as a planarization layer.

A common electrode CE may be disposed on the overcoat layer OC. The common electrode CE may be a non-patterned full electrode. A common voltage may be applied to the common electrode CE. In an exemplary embodiment, the common electrode CE may be electrically connected to common power lines (not illustrated), which is disposed in the non-display area NDA of the first substrate 500, and may thus receive the common voltage, and this will be described later in detail.

A second alignment layer may be disposed on the common electrode CE. The second alignment layer, which is for an initial alignment of the liquid crystal layer between the first substrate 500 and the second substrate 1000, may include a polymer material that causes one of decomposition, dimerization, and isomerization upon exposure to light (for example, UV light or laser). The second alignment layer may include or be formed of a polymer polymerized with reactive mesogens.

The second alignment layer may cover the common electrode CE, which is disposed on the second substrate 1000, and may be disposed on the entire surface of the common electrode CE.

In an exemplary embodiment where different voltages are applied to the common electrode CE and the pixel electrode PE, a predetermined field may be formed between the common electrode CE and the pixel electrode PE, and by using the predetermined field, the motion of liquid crystal molecules between the first substrate 500 and the second substrate 1000 may be controlled.

The non-display area NDA will hereinafter be described with reference to FIG. 4. Referring to FIG. 4, in an exemplary embodiment, one or more data drivers DU, which provide signals and/or voltages for displaying an image in the display area DA, i.e., for driving the display area DA, may be disposed in the non-display area NDA. In such an embodiment, the data drivers DU may be disposed in the non-display area NDA. FIG. 1 illustrates an exemplary embodiment in which a plurality of data drivers DU are disposed and arranged on one side of the display area DA along the x-axis direction, but the arrangement of the data drivers DU is not limited thereof shown in FIG. 1.

A plurality of wires, which are electrically connected to the data drivers DU, may be disposed in the non-display area NDA. The plurality of wires may be, for example, data fan-out lines DFLs or the common power lines (not illustrated). The data fan-out lines DFL transmit data signals provided by the data drivers DU to the data lines DL in the display area DA.

The common power lines may receive the common voltage from the data drivers DU, and may apply the common voltage to the common electrode CE of the second substrate 1000. In other words, the common power lines of the first substrate 500 may be electrically connected to the common electrode CE of the second substrate 1000.

In an exemplary embodiment, as shown in FIG. 4, the first insulating layer IL1 may be disposed in the non-display area NDA. The first insulating layer IL1 may cover the first substrate 500, and may be disposed on the entire surface of the first substrate 500. In an exemplary embodiment, the first insulating layer IL1 may include or be formed of substantially the same material as the gate insulating layer GI. In such an embodiment, the first insulating layer IL1 and the gate insulating layer GL may be integrally formed on the same layer.

The barrier pattern BP may be disposed on the first insulating layer IL1. The barrier pattern BP may be disposed on at least one side of the non-display area NDA. FIG. 1 illustrates an exemplary embodiment in which the barrier pattern BP is disposed on one side of the non-display area NDA, but the arrangement of the barrier pattern BP is not limited thereto shown in FIG. 1. In an alternative exemplary embodiment, the barrier pattern BP may be disposed on more than one side of the non-display area NDA. In another alternative exemplary embodiment, the barrier pattern BP may be disposed along the outer circumference of the non-display area NDA. In an exemplary embodiment, where the display area DA is rectangular, the barrier pattern BP may be disposed to surround the four sides of the display area DA.

The barrier pattern BP may be positioned on an inner side relative to the outer circumference of the non-display area NDA. The barrier pattern BP may be positioned on an outer side relative to the outer circumference of the display area DA. In such an embodiment, the barrier pattern BP may be disposed between the outer circumference of the non-display area NDA and the outer circumference of the display area DA.

In an exemplary embodiment, as shown in FIG. 4, the barrier pattern BP may protrude upwardly from the top surface of the first substrate 500 by a predetermined distance.

In an exemplary embodiment, the barrier pattern BP may include or be formed of the same material as the color filter in the display area DA. In an exemplary embodiment in which the color filter CF includes a red filter, a green filter and a blue filter, the barrier pattern BP may include or be formed of the same material as, for example, the blue filter. In such an embodiment, the red filter, the green filter and the blue filter may have different heights from one another, and the blue filter may be higher than the other two filters. Accordingly, in such an embodiment, the barrier pattern BP may include or be formed of the same material as the blue filter such that a sufficient height for the barrier pattern BP may be secured to properly perform functions thereof.

For convenience of description of the height of the barrier pattern BP, the distance from the first substrate 500 to the second substrate 1000 (e.g., from the top surface of the first substrate 500 to the bottom surface of the second substrate), the distance from the first substrate 500 (e.g., the top surface thereof) to a halfway point between the first substrate 500 and the second substrate 1000, and the distance from the first substrate 500 (e.g., the top surface thereof) to the highest point of the barrier pattern BP will hereinafter be referred to as a first height h1, a second height h2, and a third height h3, respectively, as shown in FIG. 4.

In an exemplary embodiment, the third height h3 may be less than the second height h2. If the third height h3 is greater than the second height h2, not only the seal pattern SLP that will be described later, but also an entire cell gap, may be adversely affected, and the first height h1 may not effectively uniformly maintained. Accordingly, the maximum value of the third height h3 may be set to be substantially equal to the second height h2.

A second insulating layer IL2 may be disposed on the barrier pattern BP and the first insulating layer IL1. The second insulating layer IL2 may cover the first insulating layer IL1 and the barrier pattern BN, and may be disposed on the entire surface of the non-display area NDA. The second insulating layer IL2 may include or be formed of substantially the same material as the passivation layer 600 in the display area DA. In an alternative exemplary embodiment, the second insulating layer IL2 may include or be formed of the same material as the first insulating layer IL1.

In another alternative exemplary embodiment, the second insulating layer IL2 may be omitted.

The seal pattern SLP may be disposed on the second insulating layer IL2.

The seal pattern SLP may bond the first substrate 500 and the second substrate 1000 together. FIG. 1 illustrates an exemplary embodiment in which the seal pattern SLP is disposed on one side of the non-display area NDA, but the arrangement of the seal pattern SLP is not limited thereto shown in FIG. 1. In an alternative exemplary embodiment, the seal pattern SLP may be disposed on at least one side of the non-display area NDA. In another alternative exemplary embodiment, the seal pattern SLP may be disposed along the outer circumference of the non-display area NDA. In an exemplary embodiment, where the display area DA is rectangular, the barrier pattern BP may be disposed to surround the four sides of the display area DA.

The seal pattern SLP may bond the first substrate 500 and the second substrate 1000 together. In such an embodiment, the seal pattern SLP may bond the first substrate 500 and the second substrate 1000 while maintaining the cell gap between the first substrate 500 and the second substrate 1000.

External side surfaces of the seal pattern SLP may be aligned with side surfaces of the first substrate 500. This may be due to a process of forming a cutting line CL to coincide with the seal pattern SLP, as performed in an exemplary embodiment of a manufacturing method of an LCD, according to the invention. However, the invention is not limited to such a manufacturing method.

In an exemplary embodiment, the external side surfaces of the seal pattern SLP may be aligned with side surfaces of at least one of the first substrate 500, the first insulating layer IL1, and the second insulating layer IL2 at the end of the non-display area NDA.

The external side surfaces of the seal pattern SLP may be aligned with side surfaces of at least one of the second substrate 1000 and the common electrode CE.

The seal pattern SLP may at least partially overlap the barrier pattern BP.

In an exemplary embodiment, the barrier pattern BP may be completely overlapped by the seal pattern SLP. In such an embodiment, the seal pattern SLP may completely cover the barrier pattern BP when viewed from a top plan view in a thickness direction of the LCD, and as a result, the barrier pattern BP may be positioned inside the seal pattern SLP.

In an exemplary embodiment where the barrier pattern BP is disposed to be overlapped by the seal pattern SLP, an out gas that may be formed during the manufacture of the LCD may be prevented from infiltrating into the inside of the display area DA and thus degrading the performance of the display area DA may be effectively prevented. In an exemplary embodiment of a manufacturing method of an LCD, according to the invention, a cutting line CL may be formed to overlap the seal pattern SLP, and laser may be irradiated along the cutting line CL. In such an embodiment of a manufacturing method, the seal pattern SLP is exposed to high-temperature laser, an out gas may be formed, and the out gas may infiltrate into the inside of the display area DA, moving along the insulating layers. In an exemplary embodiment, the barrier pattern BP is disposed to be overlapped by the seal pattern SLP, such that the barrier pattern BP may serve as a physical resistor, and may thus effectively prevent the infiltration of the out gas into the inside of the display area DA.

Alternative exemplary embodiment of LCD according to the invention will hereinafter be described. The exemplary embodiments of FIGS. 5 through 8 are substantially the same as the exemplary embodiments described above with reference to FIGS. 1-4 except for the barrier pattern BP and the seal pattern SLP. In FIGS. 1 to 8, like reference numerals denote like elements, and thus, any repetitive detailed descriptions thereof will be omitted.

Figure 5:
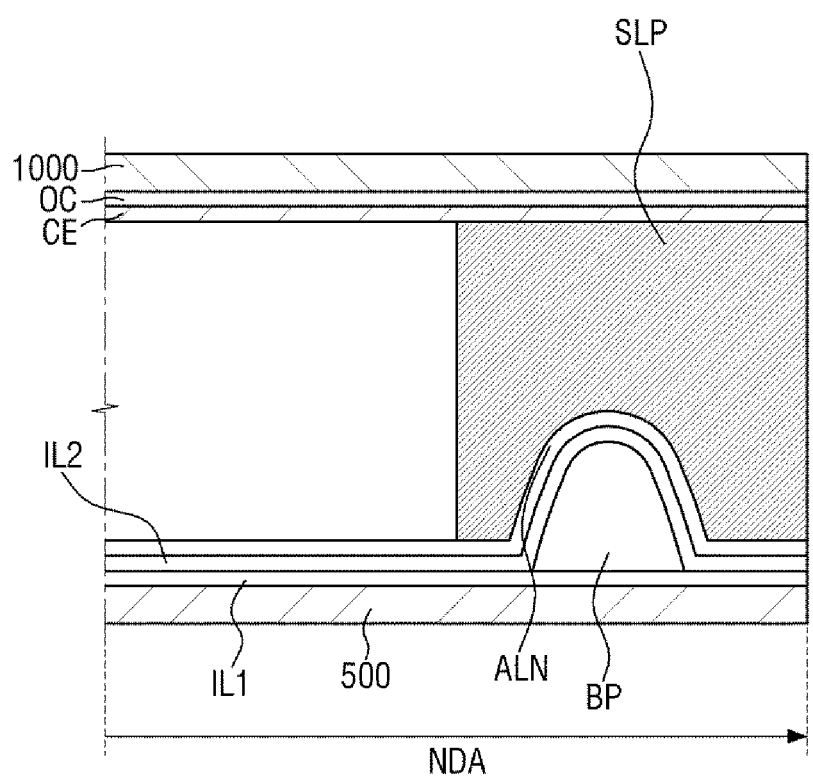
FIG. 5 is a cross-sectional view of an alternative exemplary embodiment an LCD according to of the invention.

FIG. 5 is a cross-sectional view of an alternative exemplary embodiment of an LCD according to the invention.

In an exemplary embodiment, as shown in FIG. 5, an alignment layer ALN may be disposed between a barrier pattern BP and a seal pattern SLP.

The alignment layer ALN may be disposed on a first substrate 500. The alignment layer ALN, which is for an initial alignment of a liquid crystal layer between the first substrate 500 and a second substrate 1000, may include a polymer material that causes one of decomposition, dimerization, and isomerization upon exposure to light (for example, UV light or laser). The alignment layer ALN may include or be formed of a polymer polymerized with reactive mesogens.

The alignment layer ALN may be disposed on the entire surface of the first substrate 500. In such an embodiment, the first alignment layer ALN may be disposed across a display area DA and a non-display area NDA.

The alignment layer ALN may extend to a location where the barrier pattern BP is provided. FIG. 5 illustrates an exemplary embodiment in which the alignment layer ALN completely covers the barrier pattern BP, but the invention is not limited thereto shown FIG. 5. In another alternative exemplary embodiment, the alignment layer ALN may at least partially cover the barrier pattern BP. In such an embodiment, the alignment layer ALN and the seal pattern SLP may partially overlap each other.

Figure 6:
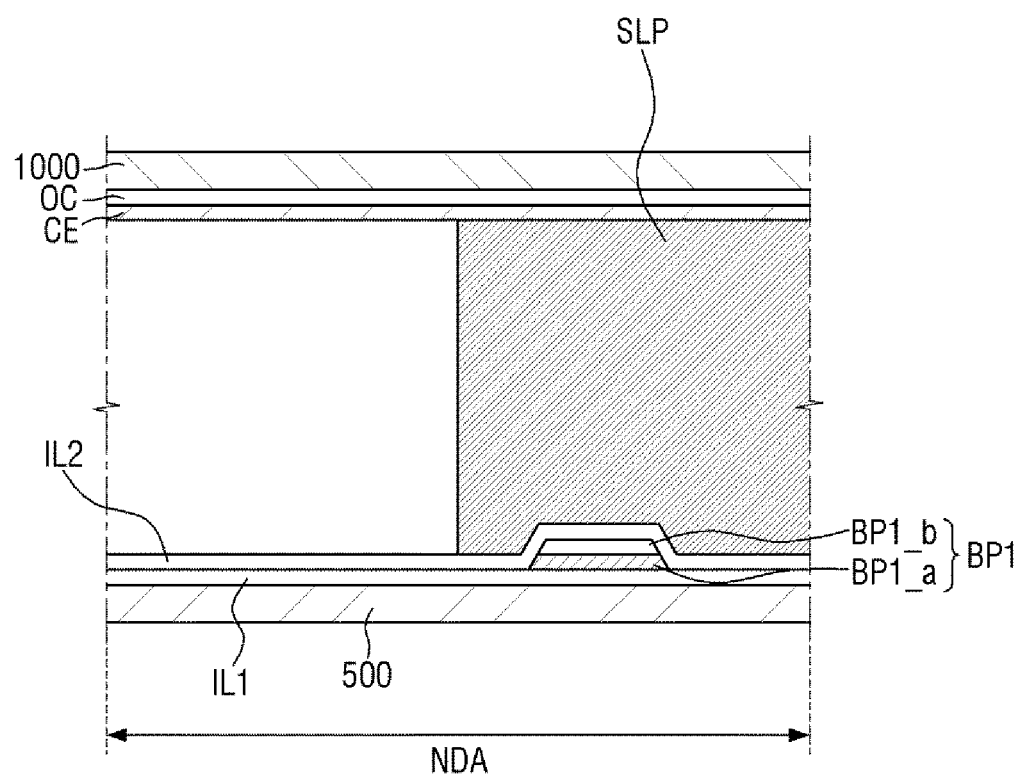
FIG. 6 is a cross-sectional view of another alternative exemplary embodiment of an LCD according to the invention.

FIG. 6 is a cross-sectional view of another alternative exemplary embodiment of an LCD according to the invention.

In an exemplary embodiment, as shown in FIG. 6, a barrier pattern BP1 may include or be formed of at least one metal layer.

In an exemplary embodiment, the barrier pattern BP1 may include or be formed of one or more metal layers. In one exemplary embodiment, for example, the barrier pattern BP1 may include a first layer barrier pattern BP1_a and a second layer barrier pattern BP1_b.

The first layer barrier pattern BP1_a may include or be formed of a metal material. The first layer barrier pattern BP1_a may include at least one selected from an Al-based metal, including an Al alloy, an Ag-based metal, including an Ag alloy, a Cu-based metal, including a Cu alloy, a Mo-based metal, including a Mo alloy, Cr, Ti, and Ta, for example, but the material of the first layer barrier pattern BP_a is not limited thereto.

In an exemplary embodiment, the first layer barrier pattern BP1_a may include or be formed of substantially the same material as the gate wiring (GL and GE). In such an embodiment, the first layer barrier pattern BP1_a and the gate wiring (GL and GE) may be formed at the same time by patterning the same metal layer, but the formation of the first layer barrier pattern BP1_a is not limited thereto.

The second layer barrier pattern BP1_b may be disposed on the first layer barrier pattern BP1_a. The second layer barrier pattern BP1_b may include or be formed of a metal material. In one exemplary embodiment, for example, the second layer barrier pattern BP1_b may include at least one selected from an Al-based metal, including an Al alloy, an Ag-based metal, including an Ag alloy, a Cu-based metal, including a Cu alloy, a Mo-based metal, including a Mo alloy, Cr, Ti, and Ta, but the material of the second layer barrier pattern BP1_b is not limited thereto.

In an exemplary embodiment, the second layer barrier pattern BP1_b may include or be formed of substantially the same material as the pixel electrode PE in the display area DA. In one exemplary embodiment, for example, the second layer barrier pattern BP1_b may be formed of a transparent conductor such as ITO or IZO or a reflective conductor such as Al.

The second layer barrier pattern BP1_b and the pixel electrode PE may be formed at the same time by patterning the same metal layer, but the invention is not limited thereto.

FIG. 6 illustrates an exemplary embodiment in which the barrier pattern BP1 includes two metal layers, but the number of metal layers included in the barrier pattern BP1 is not limited thereto shown in FIG. 6. In an alternative exemplary embodiment, the barrier pattern BP1 may include only a single metal layer or may include more than two metal layers.

Figure 7:
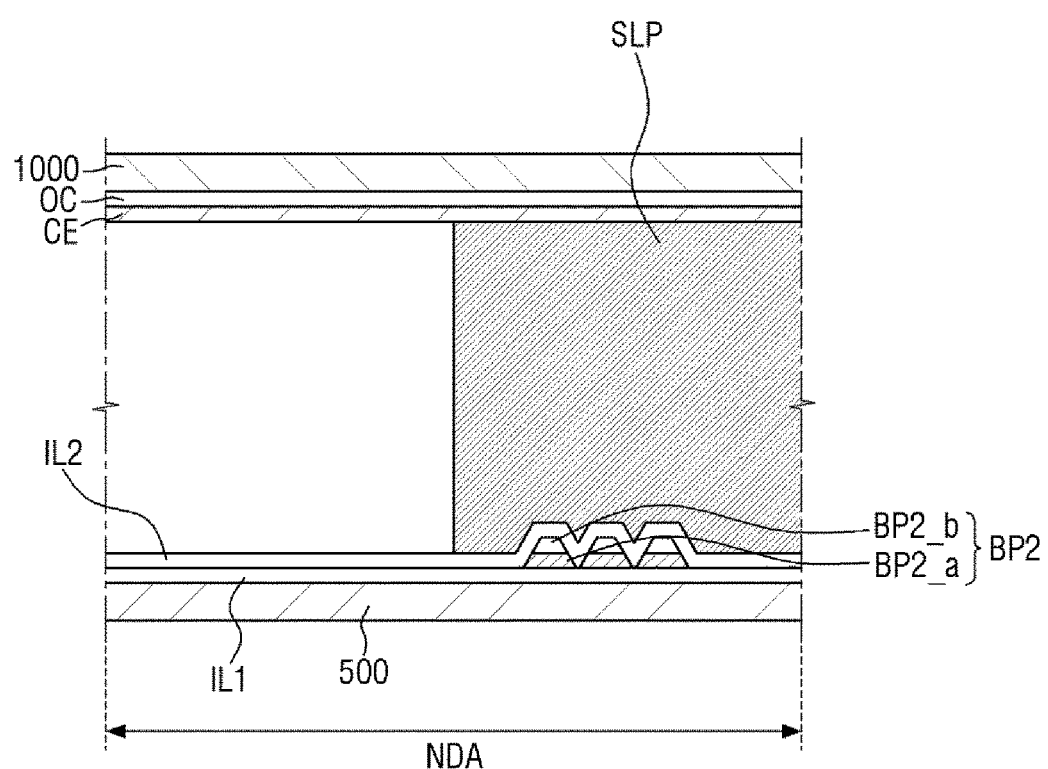
FIG. 7 is a cross-sectional view of another alternative exemplary embodiment of an LCD according to the invention.

FIG. 7 is a cross-sectional view of another alternative exemplary embodiment of an LCD according to the invention.

In an exemplary embodiment, as shown in FIG. 7, a plurality of barrier patterns BP2, which includes at least one metal layer, may be provided to be spaced from one another.

In an exemplary embodiment, the barrier patterns BP2 may be provided and may be disposed to be spaced from one another. Each of the barrier patterns BP2 may include at least one metal layer. In such an embodiment, each of the barrier patterns BP2 may include a first layer barrier pattern BP2_a and a second layer barrier pattern BP2_b. The first layer barrier pattern BP2_a and the second layer barrier pattern BP2_b may be substantially identical to the first layer barrier pattern BP1_a and the second layer barrier pattern BP1_b, respectively, of FIG. 6, and thus, detailed descriptions thereof will be omitted.

The barrier patterns BP2 may be a predetermined distance apart from one another. FIG. 7 illustrates an exemplary embodiment in which three barrier patterns BP2 are provided to be isolated from one another, but the number of barrier patterns BP2 is not limited thereto shown in FIG. 7.

In such an embodiment, as described above, the barrier patterns BP2 may extend along the outer circumference of a non-display area NDA.

In an exemplary embodiment, where the barrier patterns BP are disposed to be isolated from one another, as illustrated in FIG. 7, the ability of the barrier patterns BP to block an out gas that may be formed along a cutting line CL may be improved. In such an embodiment, the area of contact of the barrier patterns BP2 and elements to be disposed on the barrier patterns BP2 may be increased to improve the adhesive performance of the barrier patterns BP2. Accordingly, in such an embodiment, the adhesive performance of a seal pattern SLP may be improved.

Figure 8:
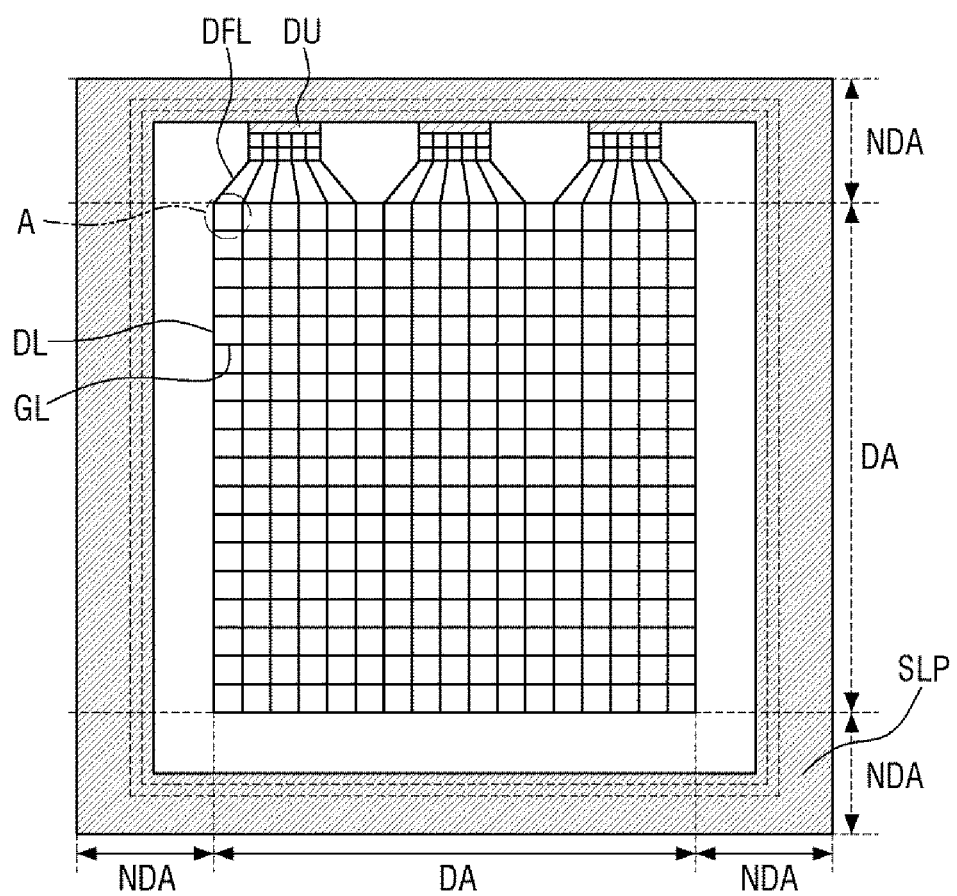
FIG. 8 is a plan view of to another alternative exemplary embodiment of an LCD according the invention.

FIG. 8 is a plan view of another alternative exemplary embodiment of an LCD according to the invention.

In an exemplary embodiment, as shown in FIG. 8, a seal pattern SLP is disposed along the outer circumference of a non-display area NDA.

In an exemplary embodiment, the seal pattern SLP may be disposed along the outer circumference of the non-display area NDA. In such an embodiment, external side surfaces of the seal pattern SLP may be aligned with side surfaces of a first substrate 500.

In an exemplary embodiment, the seal pattern SLP may have a rectangular shape with a hollow portion. In such an embodiment, the seal pattern SLP may be in the form of a frame having an opening.

In an exemplary embodiment where the seal pattern SLP has a rectangular shape with a hollow portion, a barrier pattern BP may have a shape corresponding to the shape of the seal pattern SLP. In such an embodiment, the barrier pattern BP may extend along the seal pattern SLP, overlapping the seal pattern SLP.

An exemplary embodiment of a manufacturing method of an LCD, according to the invention, will hereinafter be described. In FIGS. 1 through 11, like reference numerals denote like elements, and thus, any repetitive detailed descriptions thereof in an exemplary embodiment of the manufacturing method will be omitted.

Figure 9:
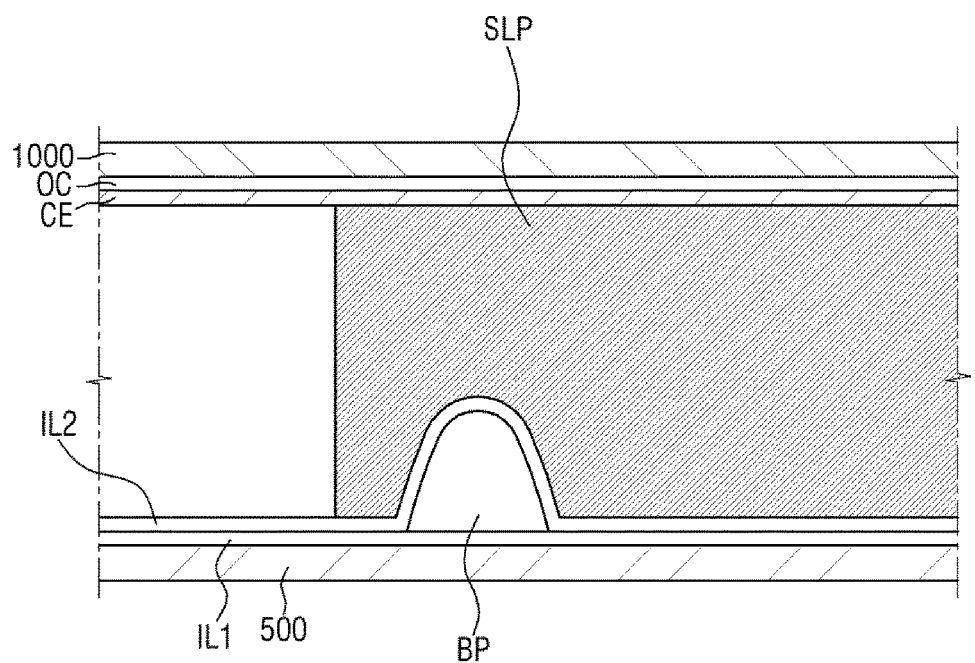
FIGS. 9 through 11 are cross-sectional views illustrating an exemplary embodiment of a manufacturing method of an LCD, according to the invention.
Figure 10:
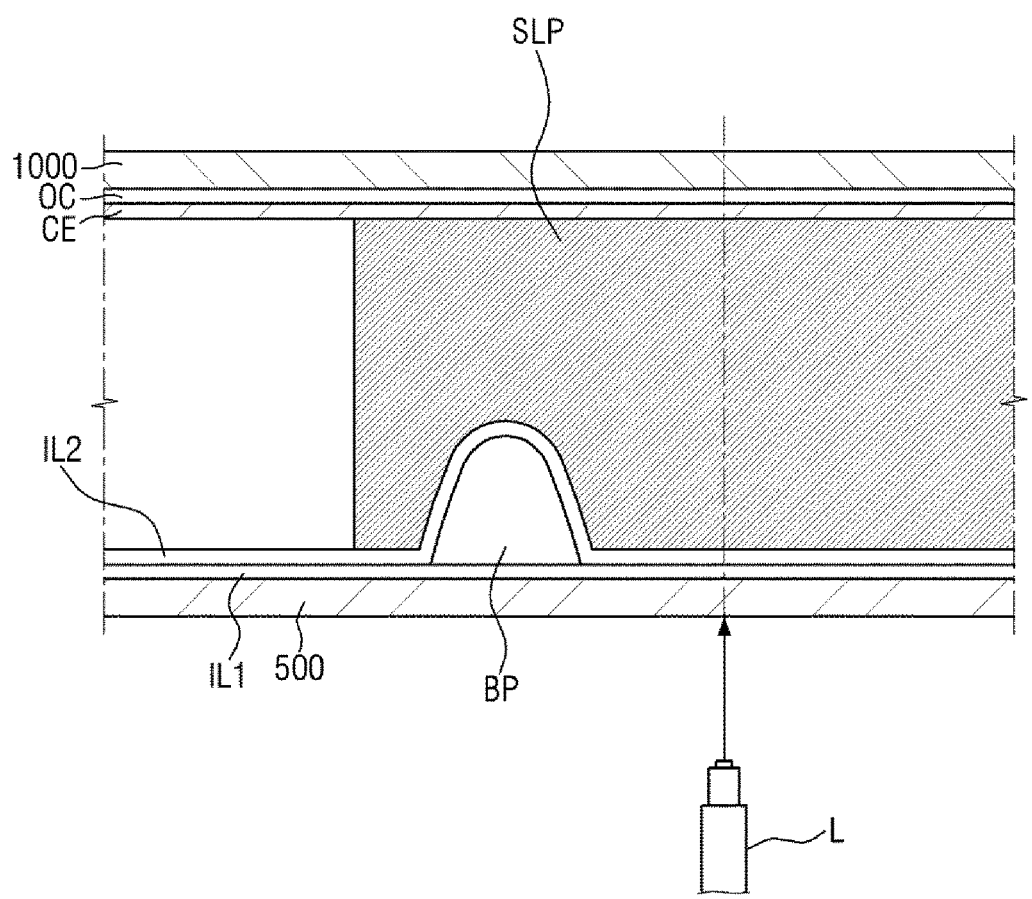
Figure 11:
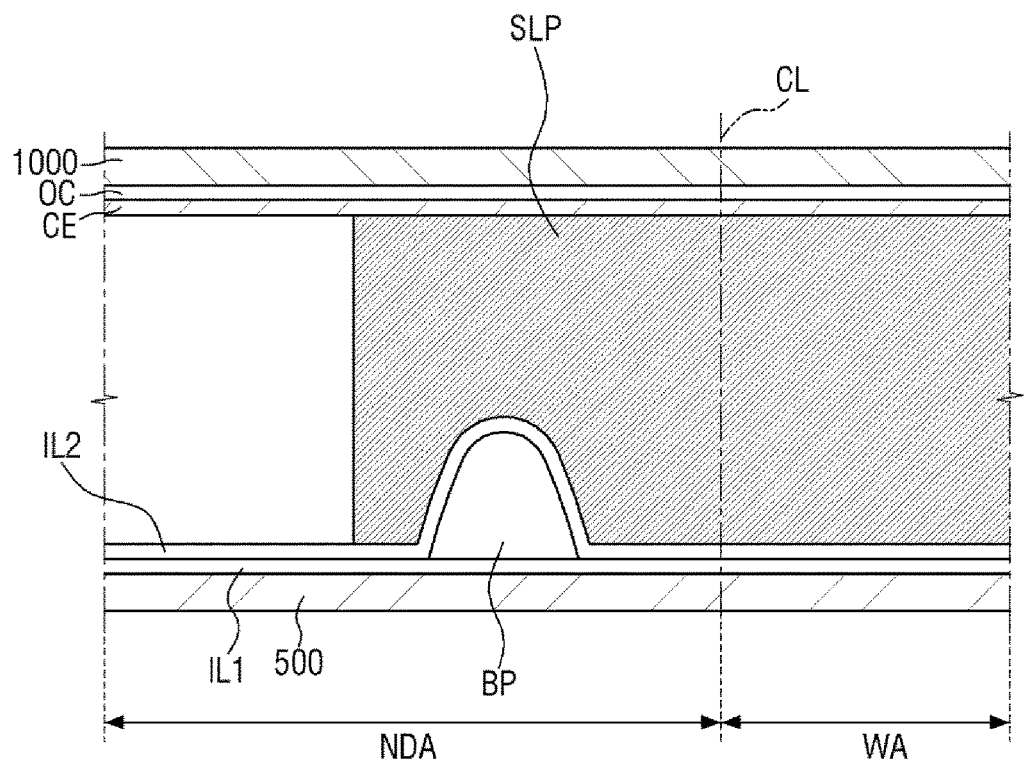

FIGS. 9 through 11 are cross-sectional views illustrating an exemplary embodiment of a manufacturing method of an LCD, according to the invention.

Referring to FIGS. 9 through 11, an exemplary embodiment of the manufacturing method includes: preparing a first substrate 500, on which a display area DA and a non-display area NDA disposed on the outside of the display area DA are defined, a first insulating layer IL1 is provided in the non-display area NDA, a barrier pattern BP is provided on the first insulating layer IL1, and a seal pattern SLP is provided to overlap the barrier pattern BP, and a second substrate 1000, which is disposed to face the first substrate 500; and cutting the first substrate 500 and the second substrate 1000 by irradiating laser along the seal pattern SLP of the first substrate 500.

Referring to FIG. 9, the first substrate 500, which includes the first insulating layer IL1 provided in the non-display area NDA, the barrier pattern BP provided on the first insulating layer IL1 and the seal pattern SLP provided to overlap the barrier pattern BP, and the second substrate 1000, which is disposed to face the first substrate 500, are prepared.

The first substrate 500, the first insulating layer IL1 disposed in the non-display area NDA, the barrier pattern BP disposed on the first insulating layer IL1, and the seal pattern SLP disposed to overlap the barrier pattern BP may be substantially the same as those of the exemplary embodiments of the LCDs described above with reference to FIGS. 1 through 8, and thus, any repetitive detailed description thereof will be omitted.

In an exemplary embodiment, the first insulating layer IL1 is provided or formed on the first substrate 500. The first insulating layer IL1 may be formed by, for example, chemical vapor deposition ("CVD") or inkjet printing, but the invention is not limited thereto.

In an exemplary embodiment, the barrier pattern BP is provided or formed on the first insulating layer IL1. The barrier pattern BP may be formed by forming a single layer using, for example, an organic insulating material or an inorganic insulating material, and patterning the single layer. As described above, the barrier pattern BP may be formed of the same material as a color filter disposed in the display area DA.

In an exemplary embodiment, a second insulating layer IL2 may be provided or formed on the first insulating layer IL1. The second insulating layer IL2 may be formed by, for example, CVD or inkjet printing. As described above, the second insulating layer IL2 may be optional and thus may be omitted.

In an exemplary embodiment, the seal pattern SLP is provided or formed on the second insulating layer IL2. The seal pattern SLP may be formed of a material having adhesive performance. The seal pattern SLP may at least partially overlap the barrier pattern BP. In an exemplary embodiment, the seal pattern SLP may completely cover the barrier pattern BP.

In an exemplary embodiment, the second substrate 1000 may be disposed to face the first substrate 500.

An overcoat layer OC and a common electrode CE, which is a full electrode, may be provided or formed on the second substrate 1000.

In an exemplary embodiment, the first substrate 500 and the second substrate 1000 may be placed close to each other and may be bonded together. In such an embodiment, the seal pattern SLP may be interposed between the first substrate 500 and the second substrate 1000, and the first substrate 500 and the second substrate 1000 may be bonded together with a cell gap therebetween maintained by the seal pattern SLP.

In an exemplary embodiment, referring to FIG. 10, laser is irradiated along the seal pattern SLP on the first substrate 500.

The laser may be irradiated by a laser irradiation apparatus L. The type of the laser may be, but is not particularly limited to, excimer laser. In such an embodiment, laser having a predetermined wavelength for cutting the first substrate 500 and the second substrate 1000 may be irradiated, and thus, a detailed description thereof will be omitted.

In an exemplary embodiment, as shown in FIG. 10, the laser may be irradiated from, for example, the bottom to the top of the first substrate 500, but the invention is not limited thereto. In such an embodiment, a direction of the irradiation of the laser is not particularly limited.

A cutting line CL may be formed by the laser. In such an embodiment, the first substrate 500 and the second substrate 1000 may be cut along the cutting line CL formed by the laser. In such an embodiment, the first substrate 500, the second substrate 100, and at least some of the elements interposed between the first substrate 500 and the second substrate 1000 may be cut by the laser. Herein, the cutting line CL may be an imaginary, or actual, cutting line that coincides with the direction of the irradiation of the laser.

In an exemplary embodiment, the first substrate 500, the first insulating layer IL1, the second insulating layer IL2, the common electrode CE, the overcoat layer OC and the second substrate 1000 may be overlapped by the irradiated laser. In an exemplary embodiment, at least some of the first substrate 500, the first insulating layer IL1, the second insulating layer IL2, the common electrode CE, the overcoat layer OC, and the second substrate 1000 may be cut by the irradiated laser. In an alternative exemplary embodiment, where the at least some of the first substrate 500, the first insulating layer IL1, the second insulating layer IL2, the common electrode CE, the overcoat layer OC, and the second substrate 1000 are not cut by the laser, a process of cutting the first substrate 500 and the second substrate 1000 along the cutting line CL may be additionally performed. The process of cutting the first substrate 500 and the second substrate 1000 along the cutting line CL may be performed using, for example, a wheel or a blade. In such an embodiment, a mechanical cutting process may be additionally performed.

When the first substrate 500, the second substrate 1000, and the elements disposed between the first substrate 500 and the second substrate 100 are cut along the cutting line CL, the non-display area NDA and the display area DA may be disposed on the inside of the cutting line CL, and a wasted area WA may be disposed on the outside of the cutting line CL.

Some exemplary embodiment of an LCD according to the invention may be obtained by an exemplary embodiment of the manufacturing method described above.

Figure 12:
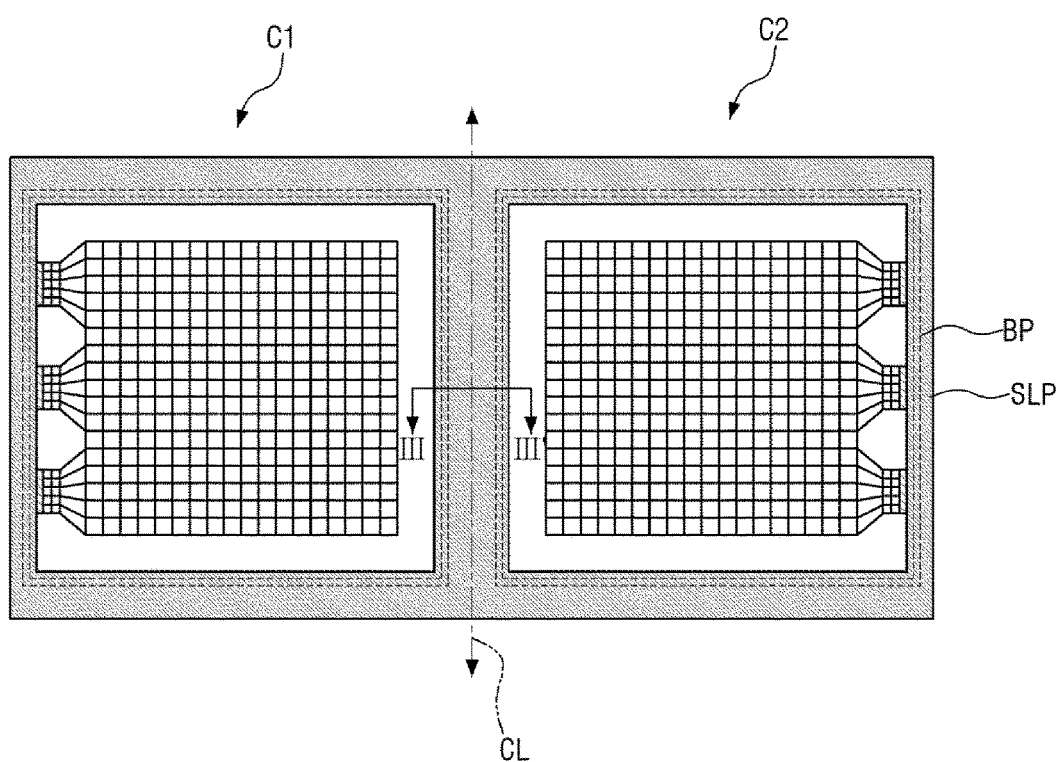
FIGS. 12 and 13 are cross-sectional views illustrating an alternative exemplary embodiment of a manufacturing method of an LCD, according to the invention.
Figure 13:
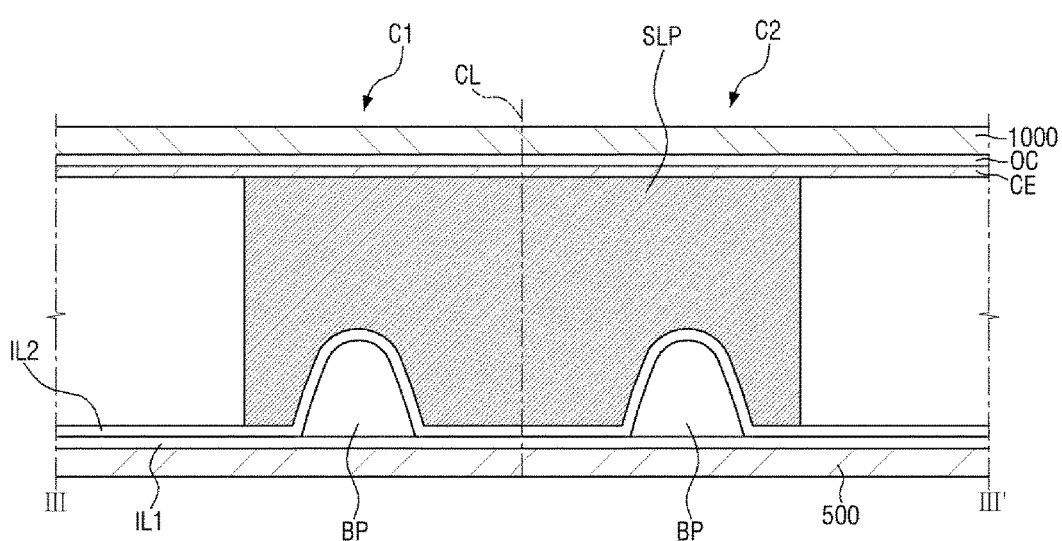

FIGS. 12 and 13 are cross-sectional views illustrating an alternative exemplary embodiment of a manufacturing method of an LCD, according to the invention.

Referring to FIGS. 12 and 13, an alternative exemplary embodiment of the manufacturing method includes: preparing a first cell C1 and a second cell C2, which are disposed adjacent to each other and are integrally formed, each of the first cell C1 and the second cell C2 including a first substrate 500, on which a first insulating layer IL1 is provided, a barrier pattern BP is provided on the first insulating layer IL1, and a seal pattern SLP is provided to overlap the barrier pattern BP, and a second substrate 1000, which is disposed to face the first substrate 500; and separating the first cell C1 and the second cell C2 by irradiating laser along the seal pattern SLP, which is disposed between the first cell C1 and the second cell C2.

In an exemplary embodiment, each cell separated from among a plurality of cells may be applied to each product. That is, a plurality of products may be obtained by cutting a mother board including a plurality of cells. Each cell may be substantially identical to their neighboring cell.

Referring to FIG. 13, each of the first cell C1 and the second cell C2 may include a first substrate 500, on which a first insulating layer IL1, a barrier pattern BP disposed on the first insulating layer IL1, and a seal pattern SLP disposed to overlap the barrier pattern BP are provided, and a second substrate 1000, which is disposed to face the first substrate 500.

Each of the first cell C1 and the second cell C2 may be substantially identical to those of the exemplary embodiment of an LCD described herein, and thus, a detailed description thereof will be omitted.

The first cell C1 and the second cell C2 may be integrally formed. More specifically, the first cell C1 and the second cell C2 may share the first substrate 500, the second substrate 1000, and at least some of the elements disposed between the first substrate 500 and the second substrate 1000.

In one exemplary embodiment, for example, the first cell C1 and the second cell C2 may share the seal pattern SLP.

In such an embodiment, referring to FIG. 13, laser may be irradiated along the seal pattern SLP, which is disposed between the first cell C1 and the second cell C2.

A cutting line CL may be formed by the laser. In an exemplary embodiment, the first substrate 500 and the second substrate 1000 may be cut along the cutting line CL formed by the laser. In such an embodiment, the first cell C1 and the second cell C2 may be separated by the cutting line CL. In such an embodiment, the first substrate 500, the second substrate 100, and at least some of the elements interposed between the first substrate 500 and the second substrate 1000 may be cut by the irradiated laser. Herein, the cutting line CL may be an imaginary, or actual, cutting line that coincides with the direction of the irradiation of the laser.

In an exemplary embodiment, the first substrate 500, the first insulating layer IL1, a second insulating layer IL2, the common electrode CE, an overcoat layer OC, and the second substrate 1000 may be overlapped by the irradiated laser. In such an embodiment, at least some of the first substrate 500, the first insulating layer IL1, the second insulating layer IL2, the common electrode CE, the overcoat layer OC, and the second substrate 1000 may be cut. In an alternative exemplary embodiment, the at least some of the first substrate 500, the first insulating layer IL1, the second insulating layer IL2, the common electrode CE, the overcoat layer OC, and the second substrate 1000 are not cut by the laser, and a process of cutting the first substrate 500 and the second substrate 1000 along the cutting line CL may be additionally performed. The process of cutting the first substrate 500 and the second substrate 1000 along the cutting line CL may be performed using, for example, a wheel or a blade. That is, a mechanical cutting process may be additionally performed.

However, the effects of the invention are not restricted to the one set forth herein. The above and other effects of the invention will become more apparent to one of daily skill in the art to which the invention pertains by referencing the claims.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A liquid crystal display comprising:
   a first substrate, on which a display area and a non-display area disposed on an outside of the display area are defined;
   a first insulating layer, which is disposed in the non-display area on the first substrate;
   a color filter disposed in the display area on the first substrate;
   a barrier pattern, which is disposed on the first insulating layer;
   a second insulating layer disposed on the barrier pattern;
   a seal pattern disposed on the second insulating layer, the seal pattern covering the barrier pattern completely;
   a second substrate, which is disposed to face the first substrate;
   an overcoat layer disposed on the second substrate;
   a common electrode disposed on the overcoat layer;
   wherein the barrier pattern directly contacts the first insulating layer and the second insulating layer,
   wherein the barrier pattern is formed of a same material as the color filter, and
   wherein an external side surface of the seal pattern, a side surface of the first substrate, a side surface of the second substrate, a side surface of the first insulating layer, a side surface of the second insulating layer, a side surface of the overcoat layer and a side surface of the common electrode are aligned with each other.

2. The liquid crystal display of claim 1, further comprising:
an alignment layer disposed on the barrier pattern.

3. The liquid crystal display of claim 1, wherein a height of the barrier pattern is the same as about a half of a distance from the first substrate to the second substrate.

4. The liquid crystal display of claim 1, wherein a height of the barrier pattern is less than about a half of a distance from the first substrate to the second substrate.

5. The liquid crystal display of claim 1, wherein the seal pattern is disposed along an outer circumference of the non-display area.

* * * * *